United States Patent
Richter et al.

(10) Patent No.: US 6,743,572 B2
(45) Date of Patent: Jun. 1, 2004

(54) METHOD FOR STRUCTURING A PHOTORESIST LAYER

(75) Inventors: Ernst Christian Richter, Erlangen-Bruck (DE); Michael Sebald, Weisendorf (DE)

(73) Assignee: Infineon Technologies AG, München (DE)

(*) Notice: Subject to any disclaimer, the term of this patent is extended or adjusted under 35 U.S.C. 154(b) by 87 days.

(21) Appl. No.: 10/134,888

(22) Filed: Apr. 29, 2002

(65) Prior Publication Data

US 2002/0187436 A1 Dec. 12, 2002

(30) Foreign Application Priority Data

Apr. 27, 2001  (DE) .......................................... 101 20 660

(51) Int. Cl.⁷ ................................................ G03F 7/00
(52) U.S. Cl. ...................... 430/322; 430/330; 430/313; 430/270.1
(58) Field of Search ................................ 430/322, 313, 430/330, 270.1

(56) References Cited

U.S. PATENT DOCUMENTS

| | | | | |
|---|---|---|---|---|
| 4,161,405 A | * | 7/1979 | Crivello | 430/280.1 |
| 5,234,793 A | | 8/1993 | Sebald et al. | 430/323 |
| 5,266,424 A | * | 11/1993 | Fujino et al. | 430/5 |
| 5,429,910 A | * | 7/1995 | Hanawa | 430/313 |
| 5,565,304 A | * | 10/1996 | Honda | 430/311 |
| 5,650,261 A | * | 7/1997 | Winkle | 430/270.1 |
| 5,932,391 A | | 8/1999 | Ushirogouchi et al. | 430/270.1 |
| 6,017,683 A | * | 1/2000 | Endo et al. | 430/326 |
| 6,096,483 A | * | 8/2000 | Harkness et al. | 430/325 |
| 6,114,086 A | | 9/2000 | Kobayashi et al. | 230/270.1 |
| 6,277,546 B1 | * | 8/2001 | Breyta et al. | 430/322 |
| 6,303,268 B1 | * | 10/2001 | Namba et al. | 430/270.1 |
| 6,338,936 B1 | * | 1/2002 | Ichikawa et al. | 430/285.1 |
| 6,436,593 B1 | * | 8/2002 | Minegishi et al. | 430/18 |
| 6,479,209 B1 | * | 11/2002 | Aoai et al. | 430/270.1 |
| 6,514,663 B1 | * | 2/2003 | Hien et al. | 430/270.1 |
| 6,517,990 B1 | * | 2/2003 | Choi et al. | 430/270.1 |
| 2001/0050741 A1 | * | 12/2001 | Hokazono et al. | 349/137 |
| 2002/0045122 A1 | * | 4/2002 | Iwasa et al. | 430/270.1 |
| 2002/0187439 A1 | * | 12/2002 | Oberlander | 430/327 |

FOREIGN PATENT DOCUMENTS

| | | | |
|---|---|---|---|
| EP | 0 395 917 | 6/1997 | |
| JP | 08-152717 | * 11/1996 | G03F/7/038 |

OTHER PUBLICATIONS

Hiroshi, "Deep–UV Resists: Evolution and Status", *Solid State Technology*, Jul. 1996, pp. 164–166, 168 and 170.

* cited by examiner

*Primary Examiner*—Mark F. Huff
*Assistant Examiner*—Daborah Chacko-Davis
(74) *Attorney, Agent, or Firm*—Schiff Hardin LLP

(57) ABSTRACT

A method for structuring a photoresist layer including preparing a substrate having a photoresist layer which is applied at least in subregions. The photoresist layer includes a film-forming polymer that comprises molecular groups that can be converted into alkali-soluble groups through acid-catalyzed separation reactions, and a photobase generator that releases a base when irradiated with light from a defined wavelength range. The photoresist layer is irradiated in subregions with light from the defined wavelength range. The photoresist layer is brought into contact with an acid over a defined period of time, during which the acid diffuses into the photoresist layer. The photoresist layer is heated to a temperature at which the acid-catalyzed separation reaction takes place and then the photoresist layer is developed. Through the acid treatment, in the developing step a greater steepness and lower degree of roughness of the resist profiles is achieved.

20 Claims, No Drawings

METHOD FOR STRUCTURING A PHOTORESIST LAYER

BACKGROUND OF THE INVENTION

The invention relates to a method for structuring a photoresist layer.

In semiconductor technology, photolithographic methods for producing integrated circuits on a semiconductor substrate play a central role. In these methods, photoresist layers are typically applied onto the surface of a substrate that is to be structured, and are subsequently structurally exposed with radiation from a suitable wavelength range. Here, the structural exposure takes place using a lithography mask, through which the structure that is to be transferred into the substrate is predetermined. The exposed regions of the photoresist layer are chemically modified by the exposure, thus modifying their polarity. In this way, the exposed and unexposed regions of the photoresist have different solubilities in relation to a corresponding developer. This fact is exploited in the subsequent developing step for the selective removal of the exposed or unexposed regions. The regions of the photoresist layer remaining on the substrate are used in the following structuring step as a mask, which protects the substrate layer located underneath it from a wearing away of material or modification of the material. Such a structuring step can be for example a plasma etching, a wet-chemical etching, or an ion implantation.

Chemically strengthened resists (chemical amplification resists; CAR) have proven particularly effective as photoresists both for one-layer resists, which can be wet-developed, and for two-layer resist systems, which can be partly or entirely dry-developed. In these photoresists, photoacid generators are used as photosensitive compounds. An overview of the subject is given by H. Ito in *Solid State Technology*, July 1996, p. 164 ff. In a selected group of these systems, the solubility modification is achieved using the principle of acid-catalyzed separation or decomposition. This principle can be used both in resists that operate positively and those that operate negatively.

In the case of a positive resist, a polar molecular group, for example a carboxylic acid, is formed during a heating step from an unpolar chemical group, for example a carboxylic acid tert.-butyl ester group, in the presence of a photolytically produced acid. Further examples of unpolar "blocked" groups that can be converted into corresponding polar groups through acid-catalyzed reactions include the tert.-butoxycarbonyloxy (t-BOC) or acetal groups. Through the conversion of the unpolar groups into the corresponding polar groups, the resist undergoes a change of polarity in the previously irradiated regions, and thus becomes soluble in relation to a polar, aqueous-alkaline or diluted alkaline developer. In this way, the exposed regions of the photoresist can be removed selectively by the developer.

In contrast to this, in negative resists the exposure effects a reduction of the solubility of the photoresist in the exposed regions. In order to achieve this, as a rule photoresists that operate negatively have groups that can be cross-linked and which can form cross-linkage reactions under the influence of radiation. Through the cross-linkage, the solubility of the exposed regions of the photoresist in a corresponding developer is reduced. The cross-linkable groups can either be bound directly to the base polymer or can be present in the photoresist as separate cross-linkage components. In chemically reinforced, negatively operating photoresists, groups that can be acid-catalytically cross-linked are used that are activated by the photolytically released acids.

Due to the ever-increasing scale of integration in semiconductor technology, the precision with which the resist profile can be produced on a surface to be structured after development is of a decisive importance. On the one hand, the resist profile is physically predefined in unambiguous fashion by the light distribution during the exposure. On the other hand, it is chemically transferred into the resist layer through the distribution of the components that are photochemically produced during the exposure.

However, due to the physical-chemical properties of the resist materials, a completely unfalsified transfer of the pattern predetermined by the lithography mask into the resist profile is not possible. In particular, interference effects and light scattering in the photoresist play an important role here. But the steps following the exposure, such as for example the developing, also influence the quality of the resist profiles. The quality of the resist profiles is essentially determined by the profile edges. In order to achieve, in subsequent process steps, a surface structuring that is as precise as possible, for example, to ensure a maximally high resolution, it would be ideal if nearly vertical, smooth profile edges could be obtained in the resist profile after the developing of the photoresist.

The light intensity profile that arises in the photoresist during the exposure has a negative effect on the steepness of the profile edges that is to be achieved. This characteristic intensity profile, also called the "a real image", results from the light scattering and light absorption that occur in the photoresist during the exposure. Because the photoresist absorbs a certain portion of the incident radiation, the observed radiation intensity decreases as the layer thickness in the photoresist increases. As a consequence, the regions close to the surface of the photoresist layer are more strongly exposed. In negative resists, this results in a stronger cross-linkage in the regions close to the surface, which thus have a lower solubility than the regions further from the surface. In the subsequent developing of the exposed photoresist, the regions of the photoresist layer far from the surface are therefore more strongly dissolved than are the regions close to the surface and situated thereabove; and this will cause the quality of the profile edges, and thus the resolution, to be worsened.

A further problem in photoresists in which a solubility modification is achieved through cross-linkage reactions is that a three-dimensional network polymer is formed in the photoresist layer in the course of the cross-linkage reaction. In comparison to the original, linear layer-forming polymer, this network polymer has a modified development characteristic, which makes the uniform resolution of the photoresist layer along the exposure boundary more difficult. This leads to "rough," for example imprecisely defined, for example lacerated, profile edges.

SUMMARY OF THE INVENTION

The present invention is therefore based on the object of providing a method for structuring a photoresist layer that reduces, or avoids entirely, the disadvantages described above. In particular, it is the object of the present invention to provide a method with which a high degree of precision is achieved in transferring the structure predetermined by the lithography mask into a negatively operating photoresist layer.

This object is achieved by the method for structuring a photoresist layer comprising the steps of: preparing a substrate having a photoresist layer which applied at least in subregions, the photoresist layer comprising a film-forming polymer that comprises molecular groups that can be converted into alkali-soluble groups through acid-catalyzed separation reactions, and a photobase generator that releases a base when irradiated with light from a defined wavelength range; irradiating the photoresist layer in the subregions with light from the defined wavelength range; contacting the photoresist layer with an acid over a defined period of time, during which the acid diffuses into the photoresist layer; heating the photoresist layer to a temperature at which the acid-catalyzed separation reaction takes place; and developing the photoresist layer. Further advantageous specific embodiments, constructions, and aspects of the present invention will be apparent from the claims and from the following description.

DESCRIPTION OF THE PREFERRED EMBODIMENTS

According to the invention, a method for structuring a photoresist layer is provided comprising the following steps: a substrate is prepared with a photoresist layer which is applied at least in subregions. The photoresist layer comprises a film-forming polymer that comprises molecular groups that can be converted into alkali-soluble groups through acid-catalyzed separation reactions, and a photobase generator that releases a base when irradiated with light from a defined wavelength range. The photoresist layer is irradiated in subregions with light from the defined wavelength range. The photoresist layer is brought into contact with an acid over a defined period of time, during which the acid diffuses into the photoresist layer. The photoresist layer is then heated to a temperature at which the acid-catalyzed separation reaction takes place. The photoresist layer is developed. In the method according to the invention, it is inessential whether the photoresist layer is brought into contact with the acid after the irradiation or before. However, it is preferred that the acid treatment take place after the exposure.

In the context of this invention, the term "alkali-soluble groups" includes all groups that increase the solubility of the film-forming polymer in alkaline solutions. This term thus includes in particular polar functional groups, such as for example carboxyl, hydroxyl, and carboxamide groups, or groups comprising these functional groups. In addition, this term is to be understood as including groups that contribute not only to an increased alkali solubility of the polymer, but also groups that in addition further increase the transparency of the polymer—and thus of the photoresist layer—for light having very short wavelengths. This can be achieved by partial or complete fluorination of these groups. A suitable group is for example the 1,1,1,3,3,3,-hexafluoro-2-hydroxyisopropyl group, which increases the transparency of the polymer at a wavelength of 157 nm.

Molecular groups that can be converted into alkali-soluble groups through acid-catalyzed separation reactions are to be understood as including acid-labile groups having only a slight alkali solubility and that separate a molecule fragment through the action of acids, with simultaneous temperature treatment if necessary, the alkali-soluble groups being released on or in the polymer. Thus, this concept includes unstable acid or acid-labile protective groups such as are used regularly in positive resists. Here, all standard acid-labile protective groups can be used, such as for example ester groups, ether groups, cyclic or acyclic acetal groups, cyclic or acyclic ketal groups, silylethers, or cyanhydrines. Examples of suitable protective groups are indicated for example in U.S. Pat. Nos. 5,932,391 or 6,114,086, whose disclosures are incorporated by reference thereto. The phrase "separation reaction catalyzed by the photolytically produced acid" is also to be understood in this sense; that for example the separation reaction takes place under the action of the photolytically released acid.

Particularly preferred acid-labile molecular groups in the present invention are ether groups selected from the group including tert.-alkyl ether, in particular tert.-butyl ether, tetrahydrofuranylether, and/or tetrahydropyranylether. Also preferred is the use of carboxyl acid esters selected from the group including tert.-alkyl ester, in particular tert.-butyl ester, tetrahydrofuranylester, tetrahydropyranylester, alkylcyclohexylester, and/or adamantylester. Acid-labile molecular groups that are likewise preferred are cyclic or acyclic ketals, cyclic or acyclic acetals, or butoxycarbonyloxy groups.

Particularly preferred are acid-labile molecular groups having the general structure according to formula II:

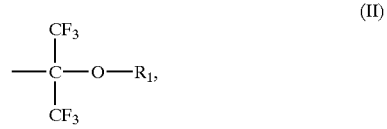
(II)

$R_1$ being selected from the group made up of tert.-alkyl groups, in particular tert.-butyl groups, tetrahydrofuranyl groups, tetrahydropyranyl groups, tert.-butoxycarbonyloxy groups, or acetal groups. These acid-labile molecular groups offer the advantage that the alkali-soluble groups remaining on the polymer can be at least partially fluorinated, which reduces the absorption of the film-forming polymer in the shortwave range.

Likewise preferred acid-labile molecular groups are groups of the general structure according to formulas III, IV or V:

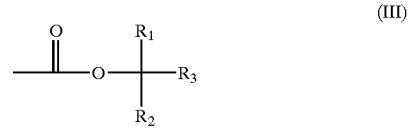
(III)

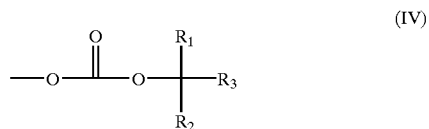
(IV)

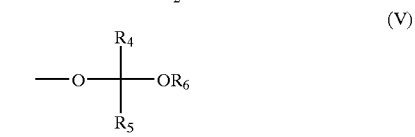
(V)

$R_1$, $R_2$, and $R_3$ being selected, independently of one another, from the group including methyl, ethyl, propyl, and butyl; preferably, $R_1$, $R_2$, and $R_3$ are methyl, and $R_4$, $R_5$, and $R_6$ are selected independently of one another from the group including hydrogen, methyl, ethyl, propyl, and butyl, with the condition that only $R_4$ or $R_5$ can be hydrogen, and $R_6$ is not hydrogen.

Besides the acid-labile groups, additional groups can be present in the polymer that improve the lithographic properties or the etching resistance of the photoresist. In a particularly preferred specific embodiment of the present invention, the polymer additionally comprises further reactive groups, such as for example anhydride groups or succinic anhydride groups. These reactive groups enable a subsequent chemical treatment, such as for example a chemical expansion of the mask through a silylation reaction. Through such a chemical after-treatment, the critical dimension (CD) that can be achieved in the lithographic method can be further reduced.

For the present invention, the nature of the main chain of the film-forming polymer is of lesser importance. Possibilities thus include all polymer types used regularly in photoresists. For example, polymers having pure carbon main chains, which can be obtained for example through polymerization of unsaturated monomers such as styroles, acrylates, or methacrylates, are suitable. Also suitable are polymers having heteroatoms in the main chains, such as for example polysiloxanes, polyether, or polyester. Here the main chain can be constructed partly or entirely from fluorinated components, in order to improve transparency at low wavelengths.

In a preferred specific embodiment of the method according to the invention, the base is released from the photobase generator through irradiation with UV light having a wavelength between 150 and 450 nm.

Here it is particularly preferred that the polymer have, in the wavelength range between 150 and 450 nm, an absorption adapted to the photobase generator. In this way, the efficiency of the photobase generator in the photoresist is further increased.

In a further preferred variant of the method according to the invention, the photobase generator is selected from the group comprising O-acyloximes, in particular O-phenylacetyl-2-acetonaphthonoxime, benzoyloxycarbonyl derivates, in particular O-nitrobenzyl-N-cyclohexylcarbamate, and nifedipines, in particular N-methylnifedipines. These photobase generators are particularly suitable because they release a base when irradiated with shortwave light from the wavelength range from 150 to 450 nm which is DUV or deep ultraviolet. However, other standard photobase generators can also be used. Further examples of suitable photobase generators are listed for example in U.S. Pat. No. 5,650,261.

In principle, any method can be used for bringing the acid into contact with the photoresist layer that enables the diffusing of the acid into the photoresist layer. In a preferred variant of the method according to the invention, the photoresist layer is exposed to a gas containing an acid. Here, the gas can consist only of the acid itself, or can be used together with an inert bearer gas. For example, a noble gas, for example helium or argon, or nitrogen, can be used as a bearer gas. These variants offer the advantage that a change from an inert atmosphere to an acid atmosphere is very easy to implement in terms of equipment.

In a further preferred specific embodiment of the method according to the invention, the photoresist layer is wetted with a liquid that contains the acid. Here, the liquid can be the acid itself or can be a solution of the acid in one or more solvents. Here, as acids all compounds are possible that can diffuse into the photoresist layer used, i.e, that are soluble in this layer, and that can neutralize the photolytically produced base, and can separate the acid-labile protective groups.

In order to trigger or to complete the acid-catalyzed separation reaction in the photoresist layer, in a preferred variant of the method according to the invention the photoresist layer is heated to a temperature in a range of 80 to 250° C. after being brought into contact with the acid.

For the developing of the exposed photoresist layer, alkaline solutions are preferably used. Water is preferably used here as a solvent. In a particularly advantageous specific embodiment of the method according to the invention, a solution of 2.38 weight % tetramethyl ammonium hydroxide in water is used as a developer solution.

In order to improve the resolution, in the method according to the invention the combination of photobase generator and acid treatment is of decisive importance. Without being limited thereto, it is presumed that through the exposure the base is released from the photobase generator into the photoresist layer. In the unexposed regions, in contrast, the photobase generator remains undecomposed. In the exposed regions, the concentration of photolytically produced base decreases with increasing depth in the photoresist layer. The acid brought into contact with the photoresist layer diffuses into the resist layer. Here a distribution gradient likewise arises, so that in the regions of the photoresist layer close to the surface a higher concentration of acid is present than in the regions far from the surface. In the exposed regions, in this way the photolytically produced base and the diffused-in acid come into contact, and can neutralize one another there. Through the heating step, in the exposed regions on the one hand the neutralization reaction is triggered or completed, and on the other hand the acid can effect the separation of acid-labile protective groups from the polymer. In the unexposed regions, in contrast, only the separation of the acid-labile protective groups takes place. Due to the neutralization of the acid by the photolytically produced base, in the exposed regions the acid-labile protective groups separate only to a small extent. This has the consequence that the polarity, and thus the solubility, of the photoresist layer likewise increases there only to a small, insignificant extent. Through the cooperation of the photolytically produced base and the diffused-in acid in the exposed regions, the polarity jump along the boundary of exposure is significantly sharper, and there is a steepening of the profile edges. In addition, smoother profile edges are obtained in the developing, because the formation of a network polymer in order to lower the polarity can be omitted.

In this method, the concentration of the photobase generator in the photoresist layer, the quantum yield or efficiency with which the decomposition of the photobase generator takes place, and/or the speed of diffusion of the acid into the photoresist layer, or of the released base onto the resist surface, are taken into account and are adapted to one another.

In an advantageous specific embodiment of the invention, the photoresist layer is applied to the substrate in that a solution comprising a solvent, the film-forming polymer, and the photobase generator is applied onto the substrate, and subsequently the solvent is at least partially vaporized. In a particularly preferred specific embodiment of the method according to the invention, the photoresist layer is spun onto the substrate. As a solvent, all standard photoresist solvents or mixtures thereof can be used that are able to absorb the resist components in a clear, particle-free, and storage-stable solution, and that are able to ensure a good layer quality in the coating of the substrate. Particularly preferred for the method according to the invention are solvents selected from the group made up of methoxylpropylacetate, cyclopentanone, cyclohexanone, γ-butyrolactone, ethyllactate, or mixtures of at least two of the solvents mentioned above. 1-methoxy-2-propylacetate is particularly preferred as a solvent.

The solvent is preferably vaporized at temperatures between 60 and 160° C. In this pre-bake heating step, as it is called, the solvent is preferably driven entirely out of the photoresist.

For the application of the photoresist layer onto the substrate, in advantageous variants of the present invention solutions are used that contain 1 to 50 weight percent and preferably 3 to 20 weight percent of the film-forming polymer; 0.01 to 10 weight percent and preferably 0.1 to 1 weight percent of the photobase generator; and 50 to 99 weight percent and preferably 88 to 96 weight percent of the solvent. The sum of all components present in the solution is 100 weight percent.

As additional components, the photoresist layer can contain additives with which an improvement of storage stability, useful life characteristic, film formation, resolution, sensitivity to radiation, or other product-improving or process-improving properties can be achieved regularly in photoresist layers or solutions thereof.

In the following, the method according to the invention is illustrated on the basis of an exemplary embodiment.

A photoresist layer as described above is spun onto the substrate to be structured and is dried in a following heating step at a temperature between 60 and 160° C., in which the solvent can vaporize. Subsequently, a latent image is produced in the solid photoresist layer obtained in this way by irradiating the photoresist layer with light of a defined wavelength. The structural exposure takes place at a wavelength of 248 nm, using a lithography mask.

Through this exposure, the base is released from the photobase generator. Due to the absorption-caused attenuation of the light intensity within the photoresist layer, the undesired base distribution arises within the photoresist layer, in which the concentration of the base continually decreases as the distance to the surface of the photoresist layer increases.

In order to counteract this, the photoresist layer is subsequently exposed to an atmosphere containing acid, whereupon the acid diffuses into the photoresist layer. In this way, an acid gradient arises within the photoresist layer, in which the concentration of the acid increases towards the surface of the photoresist layer. As a consequence of this, the photolytically released base in the exposed regions close to the surface of the photoresist layer is neutralized to a greater extent than is the case in the deeper-lying regions of this layer.

In the following heating step, called the post-exposure bake (PEB), whose temperature is between 80 and 250° C., and thus is higher than that of the first heating step, on the one hand the functional protective groups in the film-forming polymer are split by the diffused-in acid, and on the other hand the acid is neutralized by the photolytically produced base. In addition, the heating step facilitates the diffusion of the acid into the polymer layer.

In the exposed regions of the photoresist layer, in which the acid was predominantly neutralized by the base, the resist thus remains essentially insoluble in relation to the alkaline developer. Subsequently, the photoresist layer is treated for example with a 2.38 weight percent aqueous tetramethyl ammonium hydroxide solution, through which the unexposed regions of the photoresist layer are dissolved and removed. In this way, a negative relief pattern is produced in the photoresist layer and, for example, the unexposed regions of the photoresist mask are removed, while the exposed regions remain. The latter can be used as a protective mask in a subsequent structuring step.

While the preferred embodiments have been described in detail in the foregoing description, the same is to be considered as illustrative and not restrictive in character, it being understood that only the preferred embodiments have been described and that all changes and modifications that come within the spirit of the invention both now or in the future are desired to be protected.

What is claimed is:

1. A method for structuring a photoresist layer, comprising the steps of:
    preparing a substrate having a photoresist layer which is applied at least in subregions, the photoresist layer comprising a film-forming polymer that comprises molecular groups that can be converted into alkali-soluble groups through acid-catalyzed separation reactions, and a photobase generator that releases a base when irradiated with light from a defined wavelength range;
    irradiating the photoresist layer in the subregions with light from the defined wavelength range;
    contacting the photoresist layer with an acid over a defined period of time, during which the acid diffuses into the photoresist layer;
    heating the photoresist layer to a temperature at which the acid-catalyzed separation reaction takes place; and
    developing the photoresist layer by means of an alkaline solution.

2. A method according to claim 1, wherein the step of contacting comprises wetting the photoresist layer with a liquid that contains the acid.

3. A method according to claim 1, wherein the step of contacting comprises exposing the photoresist layer to a gas that contains the acid.

4. A method according to claim 3, wherein the gas contains an inert bearer gas selected from the group consisting of noble gases, helium, argon and nitrogen.

5. A method according to claim 1, wherein the acid has a pK value of less than 0.

6. A method according to claim 1, wherein the acid is selected from a group consisting of superacids, magic acids, mixtures of $H_2SO_4$ with $SO_3$, $HSO_3P$, $HSO_3Cl$, $HB(HSO_4)_4$, or $HSbF_6$, mineral acids, hexafluoroantimonic acid, sulphuric acid, perchloric acid, hydrogen chloride, hydrogen bromide and hydrogen iodide, sulfonic acids and trifluormethane sulfonic acid.

7. A method according to claim 1, wherein the step of heating heats the photoresist layer to a temperature in a range between 80 and 250° C.

8. A method according to claim 1, wherein the step of irradiating to release the base from the photobase generator uses UV light having a wavelength between 150 and 450 nm.

9. A method according to claim 1, wherein the polymer has an adapted absorption in the wavelength range between 150 and 450 nm.

10. A method according to claim 1, wherein the photobase generator is selected from a group consisting of O-acyloximes, O-phenylacetyl-2-acetonaphthonoxime, benzoyloxycarbonyl derivates, O-nitrobenzyl-N-cyclohexylcarbamate, nifedipines, and N-methylnifedipines.

11. A method according to claim 1, wherein the molecular groups that can undergo the acid-catalyzed separation reactions are selected from a group consisting of:
    a) carboxyl acid esters selected from the group including tert.-alkylester, tetrahydrofuranylester, tetrahydropyranylester, alkylcyclohexylester, and adamantylester;
    b) ether groups selected from the group including tert.-alkylether, tert.-butyl ether, tetrahydrofuranylether, and tetrahydropyranylether,
    c) cyclic ketals, acyclic ketals, cyclic acetals and acyclic acetals, and
    d) butoxycarbonyloxy groups.

12. A method according to claim 1, wherein the film-forming polymer contains anhydride structures and succinic anhydride structures.

13. A method according to claim 1, wherein the application of the photoresist layer on a substrate takes place in that a solution containing a solvent, the film-forming polymer, and the photobase generator is applied onto the substrate, and subsequently the solvent is at least partially vaporized.

14. A method according to claim 13, wherein the solvent is selected from the group consisting of 1-methoxy-2-propylacetate, cyclopentanone, cyclohexanone, γ-butyrolactone, ethyllactate, and mixtures of at least two of the solvents mentioned above.

15. A method according to claim 13, wherein the solvent is vaporized at temperatures in a range between 60 and 160° C.

16. A method according to claim 13, wherein the solution contains 1 to 50 weight percent of the film-forming polymer, 0.01 to 10 weight percent of the photobase generator, and 50 to 99 weight percent of the solvent.

17. A method according to claim 16, wherein the solution contains 3 to 20 weight percent of the film-forming polymer, 0.1 to 1 weight percent of the photobase generator and 88 to 98 weight percent of the solvent.

18. A method according to claim 1, wherein the step of developing uses a solution of 2.38 weight percent tetramethyl ammonium hydroxide in water.

19. A method for structuring a photoresist layer comprising the steps of:

preparing a substrate having a photoresist layer which is applied at least in subregions, the photoresist layer comprising a film-forming polymer that comprises molecular groups that can be converted into alkali-soluble groups through acid-catalyzed separation reactions, and a photobase generator that releases a base when irradiated with light from a defined wavelength range, the molecular groups in the polymer that can undergo the acid-catalyzed separation reactions are groups having the structure according to formula II:

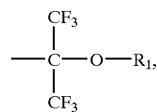
(II)

with $R_1$ being selected from the group made up of tert.-alkyl groups, tert.-butyl groups, tetrahydrofuranyl groups, tetrahydropyranyl groups, tert.-butoxycarbonyloxy groups, and acetal groups, and groups having the structure according to formulas III, IV, or V,

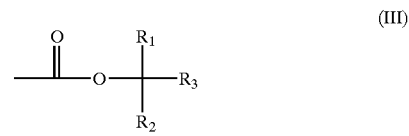
(III)

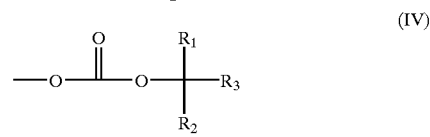
(IV)

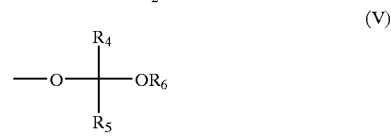
(V)

with $R_1$, $R_2$, and $R_3$ being selected independently of one another from the group including methyl, ethyl, propyl, and butyl, and $R_4$, $R_5$, and $R_6$ being selected independently of one another from the group including hydrogen, methyl, ethyl, propyl, and butyl, with the condition that only $R_4$ or $R_5$ can be hydrogen, and $R_6$ is not hydrogen;

irradiating the photoresist layer in the subregions with light from the defined wavelength range;

contacting the photoresist layer with an acid over a defined period of time, during which the acid diffuses into the photoresist layer;

heating the photoresist layer to a temperature at which the acid-catalyzed separation reaction takes place; and developing the photoresist layer.

20. A method according to claim 19, wherein $R_1$, $R_2$ and $R_3$ are methyl.

* * * * *